United States Patent
Lu

(10) Patent No.: US 11,855,623 B1
(45) Date of Patent: Dec. 26, 2023

(54) CAPACITIVE TOUCH SENSOR

(71) Applicant: Hycon Technology Corp., Taipei (TW)

(72) Inventor: Chun-Yao Lu, Taipei (TW)

(73) Assignee: HYCON TECHNOLOGY CORP., Taipei (TW)

(*) Notice: Subject to any disclaimer, the term of this patent is extended or adjusted under 35 U.S.C. 154(b) by 22 days.

(21) Appl. No.: 17/854,097

(22) Filed: Jun. 30, 2022

(51) Int. Cl.
*H03K 17/96* (2006.01)
*G01D 5/24* (2006.01)
*G01R 27/26* (2006.01)

(52) U.S. Cl.
CPC .......... *H03K 17/962* (2013.01); *G01D 5/24* (2013.01); *G01R 27/2605* (2013.01)

(58) Field of Classification Search
CPC ........ G01R 27/00; G01R 27/02; G01R 27/26; G01R 27/2605; G01D 5/00; G01D 5/12; G01D 5/14; G01D 5/24; H03K 17/00; H03K 17/94; H03K 17/96; H03K 17/962
USPC .................. 324/500, 512, 527, 531
See application file for complete search history.

(56) References Cited

U.S. PATENT DOCUMENTS

| | | | | |
|---|---|---|---|---|
| 9,244,569 B2* | 1/2016 | Guedon | ............... | G06F 3/0446 |
| 9,523,725 B2* | 12/2016 | Tan | .......... | G06F 3/044 |
| 10,891,006 B2* | 1/2021 | Ahn | ...................... | G06F 3/0412 |
| 11,048,367 B2* | 6/2021 | Reynolds | ............. | H03K 17/955 |
| 11,644,929 B2* | 5/2023 | Yu | ..................... | G06F 3/041662 |
| | | | | 345/174 |
| 2015/0212650 A1* | 7/2015 | Noto | ..................... | G06F 3/0446 |
| | | | | 345/174 |
| 2017/0315642 A1* | 11/2017 | Yang | ....................... | G01D 5/24 |

FOREIGN PATENT DOCUMENTS

CN       102207804 A       10/2011

OTHER PUBLICATIONS

Taiwan Office Action and Search Report for Application No. 111120760 dated Jul. 17, 2023.

* cited by examiner

*Primary Examiner* — Hoai-An D. Nguyen
(74) *Attorney, Agent, or Firm* — Jackson IPG P LLC; Demian K. Jackson

(57) ABSTRACT

A capacitive touch sensor includes a touch interface, a switch, and a sensing circuit. The switch circuit switches based on sensing conditions of self-capacitance and mutual capacitance. The sensing circuit is used for both the self-capacitance mode and the self-capacitance mode to simplify circuit structure and save circuit area and power consumption. The output sensing voltage from the sensing circuit is stable. A differential mode is designed to improve noise interference and enhance accuracy of judging the touch effect. Then, the self-capacitance mode is utilized for the areas of possible touches to save operation time for the capacitance mode.

14 Claims, 11 Drawing Sheets

CAPACITIVE TOUCH SENSOR

FIELD OF THE INVENTION

The present invention relates to a touch sensor. More specifically, the present invention relates to a capacitive touch sensor which can be switched among self-capacitance, mutual capacitance, and differential modes.

BACKGROUND OF THE INVENTION

A capacitive touch sensor used as an input tool for a human-machine interface is generally divided into self-capacitance and mutual capacitance. The so-called self-capacitance means that the driving electrode and the sensing electrode are the same one, and the change of the equivalent capacitance value of the electrode is detected to determine the touch effect. The mutual capacitance means that the driving electrode and the sensing electrode are two separated electrodes, and the change of the equivalent capacitance value between the driving electrode and the sensing electrode is detected to determine the touch effect. Both self-capacitance and mutual capacitance have their own advantages and disadvantages. When a touch panel is divided into M*N touch channels, self-capacitance needs only M+N scans, while mutual capacitance requires M*N scans, which takes a longer time for scanning. However, self-capacitance has the problem of ghost points, and misjudgment occurs when multi-touch is performed. In contrast, mutual capacitance does not have such a problem, and thus multi-touch can be realized.

Taiwan Patent No. I630523 discloses a touch device, a sensing method, and a touch sensing circuit. Compared with the prior art, different sensing modes need to be matched with different sensing circuits. This patent discloses that the same sensing circuit can be used to realize self-capacitance and mutual-capacity multi-mode sensing through switching of the switch circuit, which simplifies the circuit. Structure. However, its disadvantage is that it needs to be equipped with a specially designed touch panel. When the touch panel is divided into M*N touch channels, M*N traces need to be connected to the switch circuit and the sensing circuit. The panel only needs M+N traces to connect to the sensing circuit, so the complex panel traces greatly reduce the practicality.

Taiwan Patent No. I489365 discloses a capacitive touch sensor and a switching method for self-capacitance and mutual capacitance, in which a driving unit and a sensing unit are integrated through switching of an analog multiplexer to simplify the circuit structure. This structure can be implemented with a commonly used touch panel by connecting M+N traces to the sensing circuit. However, it has a disadvantage that the self-capacitance mode and the mutual capacitance mode need to be provided with a voltage source and a current source, respectively, thereby increasing power consumption. Moreover, in this structure, the output sensing voltage has a jitter, which will affect the accuracy of judging the touch effect.

China Patent No. CN103197787 discloses a capacitive touch sensor, in which the sensing values of self-capacitance and mutual capacitance are combined to eliminate noise. However, it has a disadvantage of taking a longer scanning time to execute self-capacitance mode and mutual capacitance mode, thereby reducing the response speed of the touch effect for a large panel with a large number of channels.

China Patent No. CN103257760 discloses a time-saving scanning method for a capacitive touch sensor, in which a first-stage preliminary scan is performed first, and then a second-stage precise scan for areas that may generate touch points is performed. The above method includes only the concept of mutual capacitance scanning. If the judgment is made in combination with the scanning results of the self-capacitance mode, the scanning time can be further optimized.

In view of the above problems, the present invention discloses a capacitive touch sensor capable of switching between self-capacitance and mutual capacitance. Compared with the prior arts, the sensing circuit of the present invention can realize sensing of self-capacitance and mutual capacitance when combined with a commonly used touch panel, without an additional current source, thereby saving circuit area and power consumption, and a differential mode is designed to improve noise interference and enhance accuracy of judging the touch effect. In combination with the scan results of self-capacitance mode and self-capacitance mode to make judgments, scan time is saved and response speed is enhanced.

SUMMARY OF THE INVENTION

The present invention discloses a capacitive touch sensor comprising a touch interface having first lines and second lines; a first switch circuit connected between the first lines and a mutual capacitance voltage; a second switch circuit, connected with the first lines and the second lines, for receiving a self-capacitance voltage and generating a sensing input voltage; and a sensing circuit for receiving the sensing input voltage and generating a sensing output voltage.

In the above capacitive touch sensor, the first switch circuit comprises at least a first switch unit connected between the first lines and the mutual capacitance voltage.

In the above capacitive touch sensor, the second switch circuit comprises second switch units, each including: a self-capacitance voltage switch connected between the self-capacitance voltage and the touch interface; a first sensing switch connected between the touch interface and output terminals of the switch units; and a second sensing switch connected between output terminals of the switch circuits and adjacent switch unit.

In the above capacitive touch sensor, the second switch unit further comprises a second self-capacitance switch connected between a second self-capacitance voltage and the touch interface.

In the above capacitive touch sensor, the sensor is provided with: a mutual capacitance mode, in which the first switch circuit conducts the first switch units sequentially and provides the mutual capacitance voltage to the first lines whereas the second switch units conduct the first sensing switch and turn off the self-capacitance voltage switch, the second sensing switch and the second self-capacitance switch; and a self-capacitance mode, in which the first switch units are turned off, the second switch units conduct the first sensing switch or the second sensing switch based on channel scan, the self-capacitance voltage switch or the second self-capacitance switch is conducted based on operation timing of the sensing circuit, and the self-capacitance voltage or the second self-capacitance voltage is provided to the second lines or the first lines.

In the above capacitive touch sensor, the self-capacitance mode comprises: an odd mode, in which the first sensing switch and the second sensing switch in the odd-numbered second switch units are conducted, the self-capacitance voltage switch is conducted based on operation timing of the sensing circuit, and the second self-capacitance switch is turned off; and the first sensing switch and the second sensing switch in the even-numbered second switch units are turned off, the second self-capacitance switch is conducted based on operation timing of the sensing circuit, and the self-capacitance voltage switch is turned off; and an even mode, in which the first sensing switch and the second sensing switch in the even-numbered second switch units are conducted, the second self-capacitance switch is conducted based on operation timing of the sensing circuit, and the self-capacitance voltage switch is turned off; and the first sensing switch and the second sensing switch in the odd-numbered second switch units are turned off, the elf-capacitance voltage switch is conducted based on operation timing of the sensing circuit, and the second self-capacitance switch is turned off.

In the above capacitive touch sensor, the sensing circuit comprises one or more sensing units; when there is only one sensing unit, the first sensing switch or the second sensing switch in the second switch units are sequentially conducted during scanning to obtain a sensing output voltage from each of the first line or the second line; and when there are more than one sensing unit, the second switch units have out terminals connected to the sensing units to conduct the first sensing switch or the second sensing switch, thereby obtaining sensing output voltages from the sensing units.

In the above capacitive touch sensor, the sensing unit comprises: a first amplifier having a positive input terminal connected to a reference voltage and a negative input terminal connected to an output terminal of the switch circuit, the negative input terminal and the output terminal of the first amplifier being connected with a first capacitor and a first timing switch; and a second amplifier having a positive input terminal connected to the reference voltage and a negative input terminal connected to the output terminal of the first amplifier through a first resistor and a second timing switch, the negative input terminal and an output terminal of the second amplifier being connected with a second capacitor and a third timing switch; and the output terminal of the second amplifier is used for output of the sensing circuit.

In the above capacitive touch sensor, the sensing unit further comprises a third amplifier having a positive input terminal connected to the reference voltage and a negative input terminal connected to the first resistor through a second timing negative switch, the negative input terminal and an output terminal of the third amplifier being connected with a second negative capacitor and a third timing negative switch; and the output terminal of the third amplifier is used for negative output of the sensing circuit.

In the above capacitive touch sensor, the sensing unit is connected with a switching circuit for receiving at least two voltages among the sensing output voltage, the sensing output voltage of the adjacent sensing unit and the reference voltage, and outputting a switching circuit positive output voltage and a switching circuit negative output voltage, and is provided with: a first switching mode, in which the sensing output voltage of the sensing unit and the sensing output voltage of the adjacent sensing unit are selected as the switching circuit positive output voltage and the switching circuit negative output voltage, respectively; and a second switching mode, in which the sensing output voltage of the sensing unit and the reference voltage are selected as the switching circuit positive output voltage and the switching circuit negative output voltage, respectively.

In the above capacitive touch sensor, the sensing unit sends a sensing negative output voltage to a switching circuit for receiving at least two voltages among the sensing output voltage, the sensing negative output voltage, the sensing output voltage of the adjacent sensing unit, the sensing negative output voltage of the sensing unit, and the reference voltage, and for outputting a switching circuit positive output voltage and a switching circuit negative output voltage, and is provided with: a first switching mode, in which the sensing output voltage of the sensing unit and the sensing output voltage of the adjacent sensing unit selected as the switching circuit positive output voltage and the switching circuit negative output voltage, respectively; a second switching mode, in which the sensing output voltage of the sensing unit and the reference voltage are selected as the switching circuit positive output voltage and the switching circuit negative output voltage, respectively; a third switching mode, in which the sensing negative output voltage of the sensing unit and the sensing negative output voltage of the adjacent sensing unit are selected as the switching circuit positive output voltage and the switching circuit negative output voltage, respectively; and a fourth switching mode, in which the sensing negative output voltage of the sensing unit and the reference voltage are selected as the switching circuit positive output voltage and the switching circuit negative output voltage, respectively.

The above capacitive touch sensor further comprises an analog/digital converter for receiving voltages from the sensing circuit and the switching circuit and outputting a digital signal.

In the above capacitive touch sensor, each of the first lines or the second lines in the touch interface is connected with a reference capacitance switch having another end connected to a reference capacitor applied with a mutual capacitance second voltage; and the reference capacitance switches are conducted in the mutual capacitance mode and turned off in the self-capacitance mode.

In the above capacitive touch sensor, the self-capacitance mode is executed first to determine whether there are any self-capacitance sensing values in the first lines exceeding a predetermined range, and then the mutual capacitance mode is executed to carry out mutual capacitance scan for the first lines having self-capacitance sensing values exceeding the predetermined range and ignore the rest of the first lines.

According to the present invention, self-capacitance mode scan is not applied to non-touched areas, and thus the scan time is saved in comparison with conventional methods which need to scan every channel.

This paragraph extracts and compiles some features of the present invention; other features will be disclosed in the follow-up paragraphs. It is intended to cover various modifications and similar arrangements included within the spirit and scope of the appended claims.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

The present invention will now be described more specifically with reference to the following embodiments.

Figure 1:
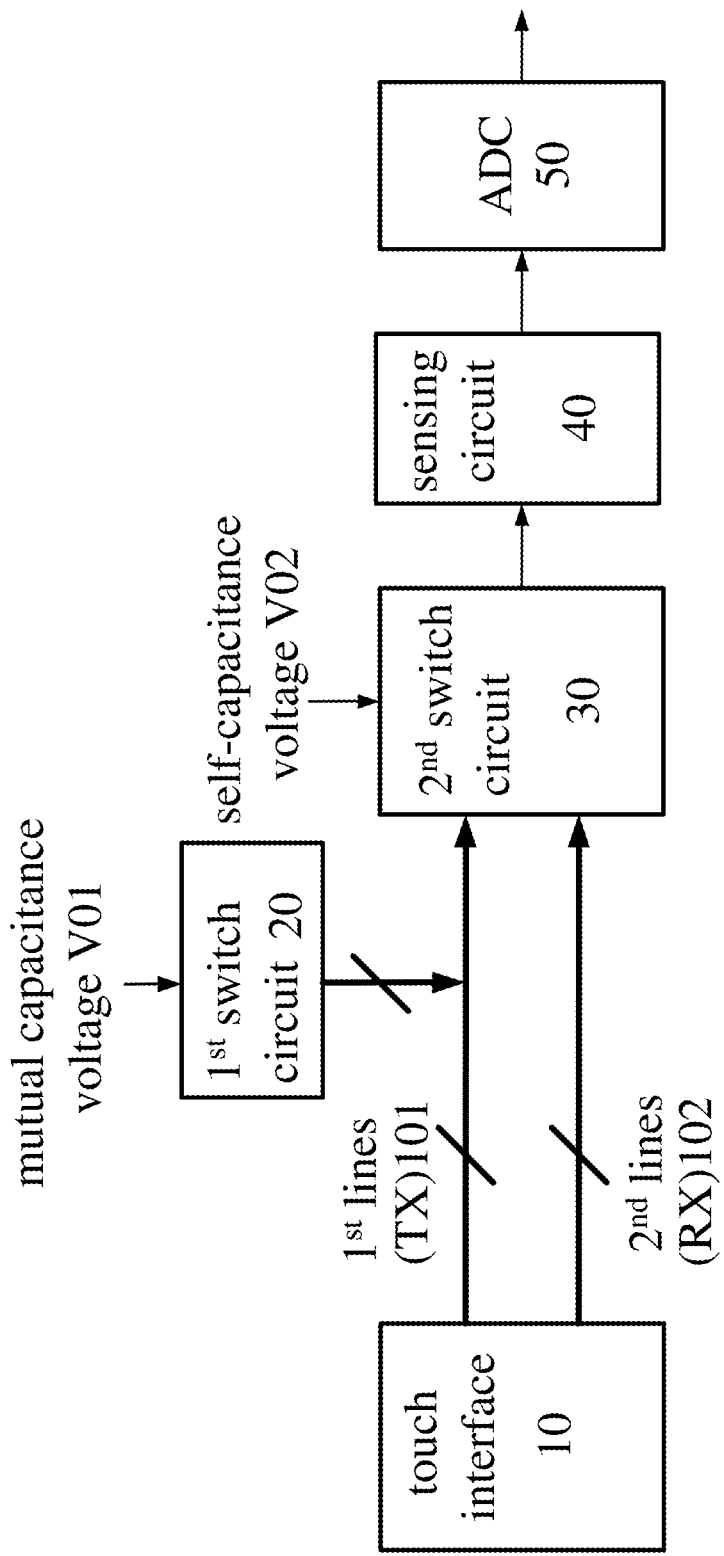
FIG. 1 illustrates a structure of a capacitive touch sensor according to a first embodiment of the present invention structure.

A first embodiment of the present invention is shown in FIG. 1. It illustrates a structure of a capacitive touch sensor. The capacitive touch sensor comprises a touch interface 10 having first lines (TX) 101 and second lines (RX) 102; a first switch circuit 20 connected between the first lines (TX) 101 and a mutual capacitance voltage V01; a second switch circuit 30, connected with the first lines (TX) 101 and the second lines (RX) 102 for receiving a self-capacitance voltage V02 and generating a sensing input voltage V03; a sensing circuit 40 for receiving the sensing input voltage V03 and generating a sensing output voltage V04; and a analog/digital converter for receiving the sensing output voltage V04 and generating a digital output signal.

Figure 2:
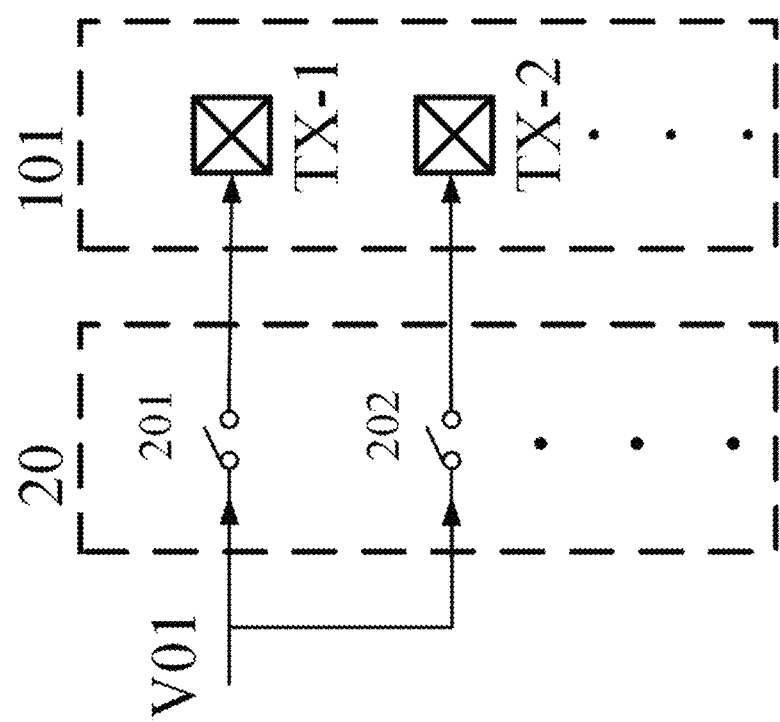
FIG. 2 illustrates a structure of the first switch circuit in FIG. 1.

FIG. 2 illustrates a circuit structure of the first switch circuit 20. The first switch circuit 20 comprises first switch units 201 and 202, each of which is connected between the first line (TX) 101 and the mutual capacitance voltage V01. Generally, the mutual capacitance voltage V01 has a square waveform.

Figure 3:
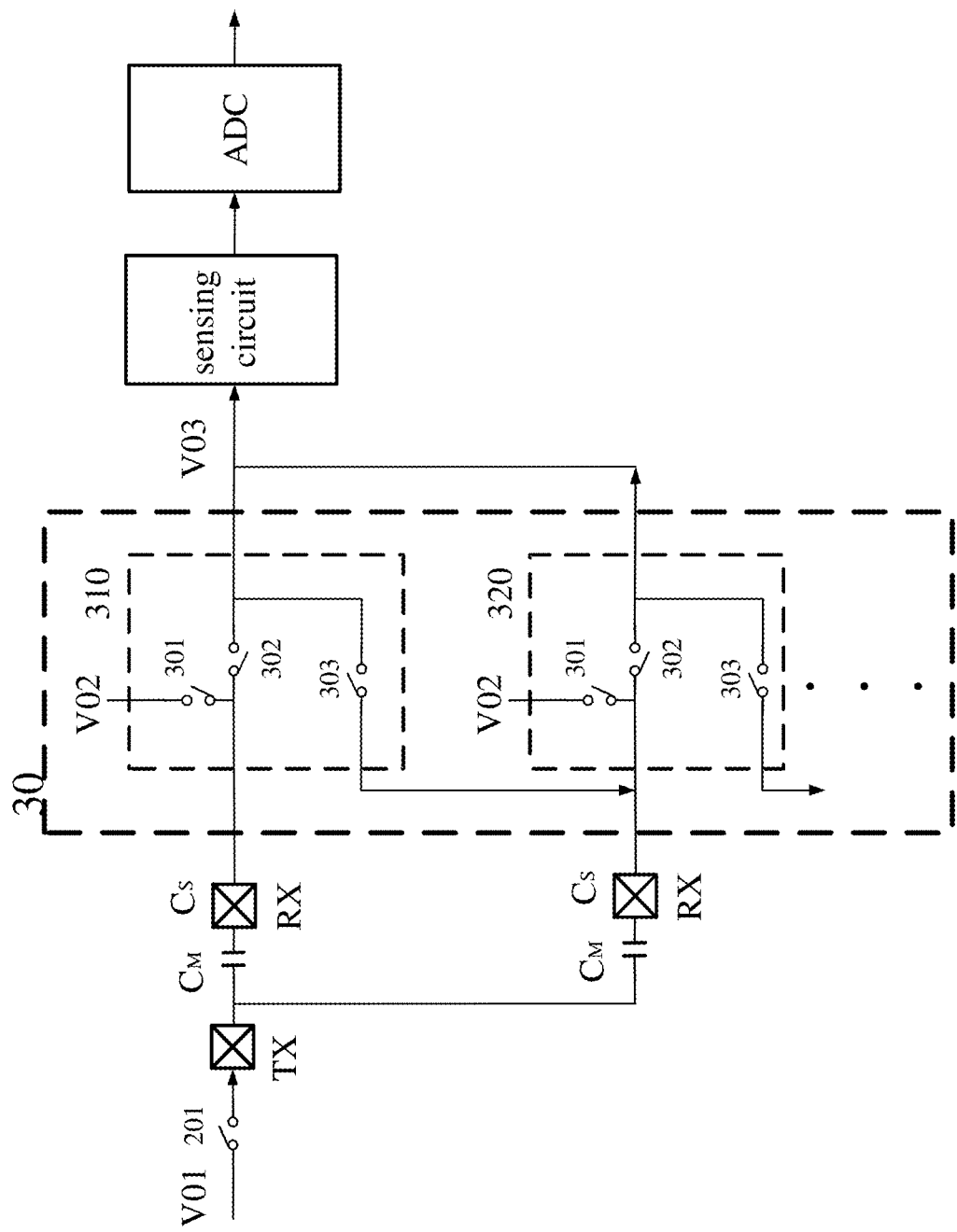
FIG. 3 illustrates a structure of the second switch circuit in FIG. 1.

FIG. 3 illustrates a circuit structure of the second switch circuit As shown, CM represents inducted capacitance between the first lines (TX) 101 and the second lines (RX) 102 in the mutual capacitance mode, and $C_S$ represents inducted capacitance of the first lines (TX) 101 or the second lines (RX) 102 in the self-capacitance mode. The second switch circuit 30 comprises second switch units 310 and 320. Each of the switch units 310 and 320 comprises a self-capacitance voltage switch 301 connected between the self-capacitance voltage V02 and the first lines (TX) 101 or the second lines (RX) 102; a first sensing switch 302 connected between the first lines (TX) 101 or the second lines (RX) 102 and the sensing input voltage V03; and a second sensing switch 303 connected between the sensing input voltage V03 and the adjacent second switch unit 320. Generally, the self-capacitance voltage V02 is a fixed DC voltage.

Figure 4:
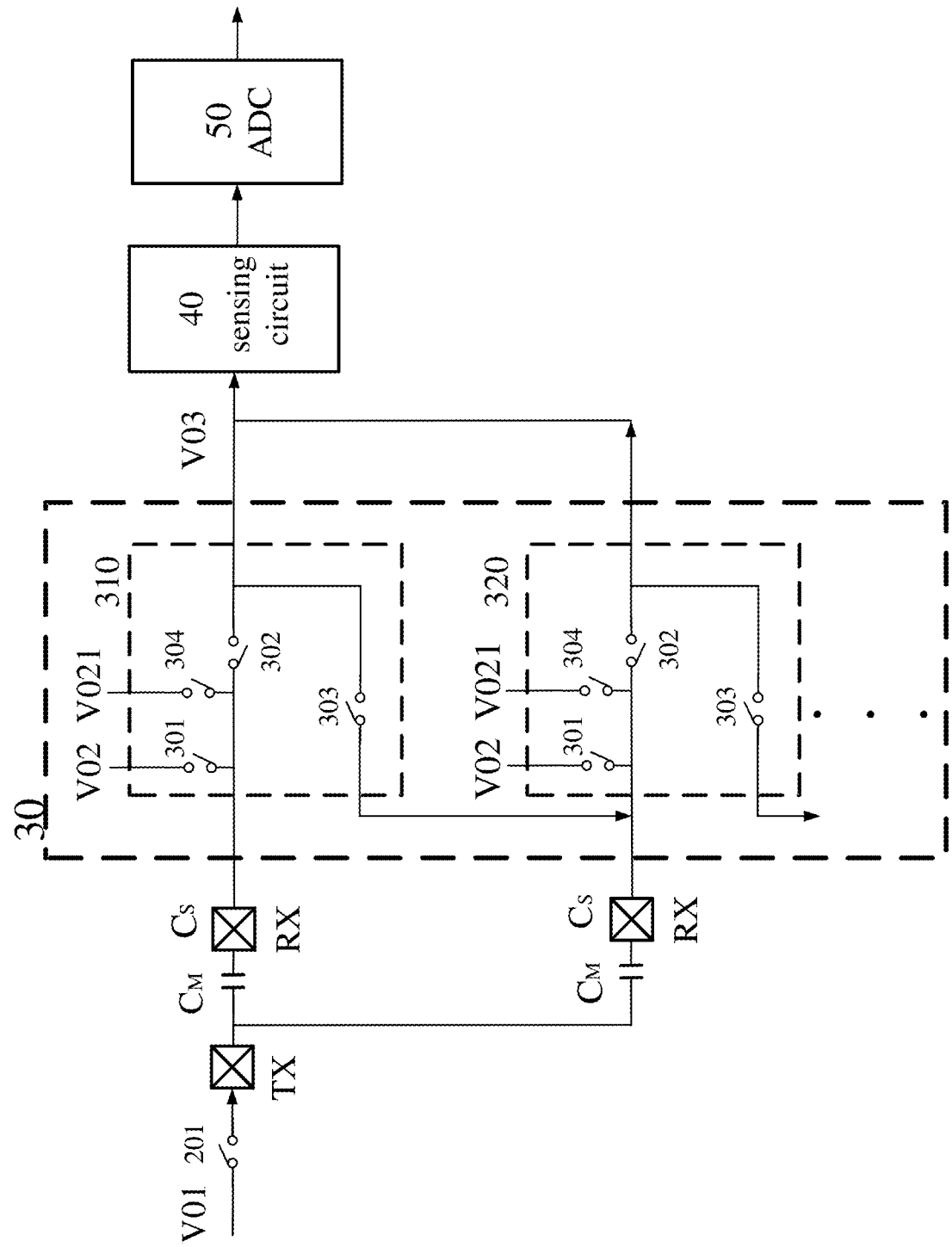
FIG. 4 illustrates a different structure from the second switch circuit of FIG. 3.

FIG. 4 illustrates another circuit structure of the second switch circuit 30. In comparison with FIG. 3, the second switch units 310 and 320 in FIG. 4 further comprises a second self-capacitance voltage V021 and a second self-capacitance switch 304 connected between the second self-capacitance voltage V021 and the first lines (TX) 101 or the second lines (RX) 102. Generally, the second self-capacitance voltage V021 is a fixed DC voltage.

In the above capacitive touch sensor, the first switch circuit 20 and the second switch circuit 30 are operated as follows: a mutual capacitance mode, in which the first switch units 201 and 202 are sequentially conducted, the mutual capacitance voltage V01 is provided to the first lines (TX) 101, each of the second switch units 310 and 320 conducts the first sensing switch 302, and the self-capacitance voltage switch 301, the second sensing switch 303 and the second self-capacitance switch 304 are turned off; and a self-capacitance mode, in which the first switch circuit 20 is turned off, each of the second switch units 310 and 320 conducts the first sensing switch 302 or the second sensing switch 303 based on channel scan, and the self-capacitance voltage switch 301 or the second self-capacitance switch 304 is conducted based on operation timing of the sensing circuit 40.

In the above capacitive touch sensor, the self-capacitance mode comprises two modes. In an odd mode, the first sensing switch 302 and the second sensing switch 303 in the odd-numbered second switch units 310 are conducted, the self-capacitance voltage switch 301 is conducted based on operation timing of the sensing circuit 40, and the second self-capacitance switch 304 is turned off; the first sensing switch 302 and the second sensing switch 303 in the even-numbered second switch units 320 are turned off, the second self-capacitance switch 304 is conducted based on operation timing of the sensing circuit 40, and the self-capacitance voltage switch 301 is turned off. In an even mode, the first sensing switch 302 and the second sensing switch 303 in the odd-numbered second switch units 310 are turned off, the second self-capacitance switch 304 is conducted based on operation timing of the sensing circuit 40, and the self-capacitance voltage switch 301 is turned off; the first sensing switch 302 and the second sensing switch 303 in the even-numbered second switch units 320 are conducted, the self-capacitance voltage switch 301 is conducted based on operation timing of the sensing circuit 40, and the second self-capacitance switch 304 is turned off. For simplification, description for more second switch units is omitted.

Figure 5:
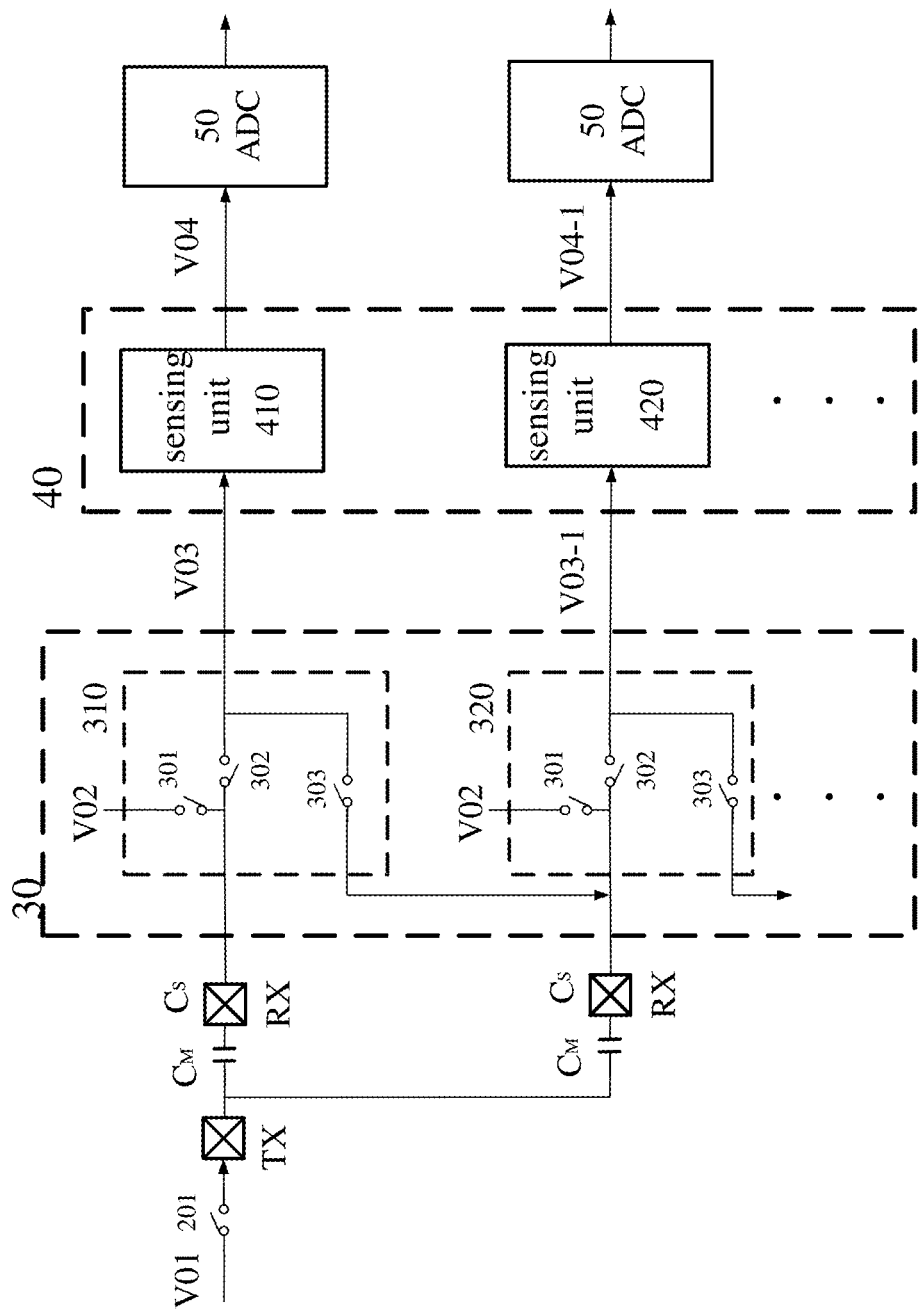
FIG. 5 illustrates a structure of the sensing circuit in FIG. 1.

FIG. 5 illustrates a structure of the sensing circuit 40 comprising sensing units 410 and 420. If the sensing unit 410 does not exist, no matter whether it is in the mutual capacitance mode or the self-capacitance mode, the first sensing switches 302 or the second sensing switches 303 in the second switch units 310 and 320 needs to be sequentially conducted to obtain sensing output voltage V04 in each channel. In contrast, when there are more than one sensing unit, output terminals V03 and V03-1 of the second switch units 310 and 320 can be connected to the sensing units 410 and 420, respectively, thereby conducting the first sensing switches 302 or the second sensing switches 303 and obtaining sensing output voltages V04 and V04-1 of the channels. Besides, multiple analog/digital converters 50 can be used to convert the sensing output voltages V04 and V04-1 of the channels into digital output signals.

Figure 6:
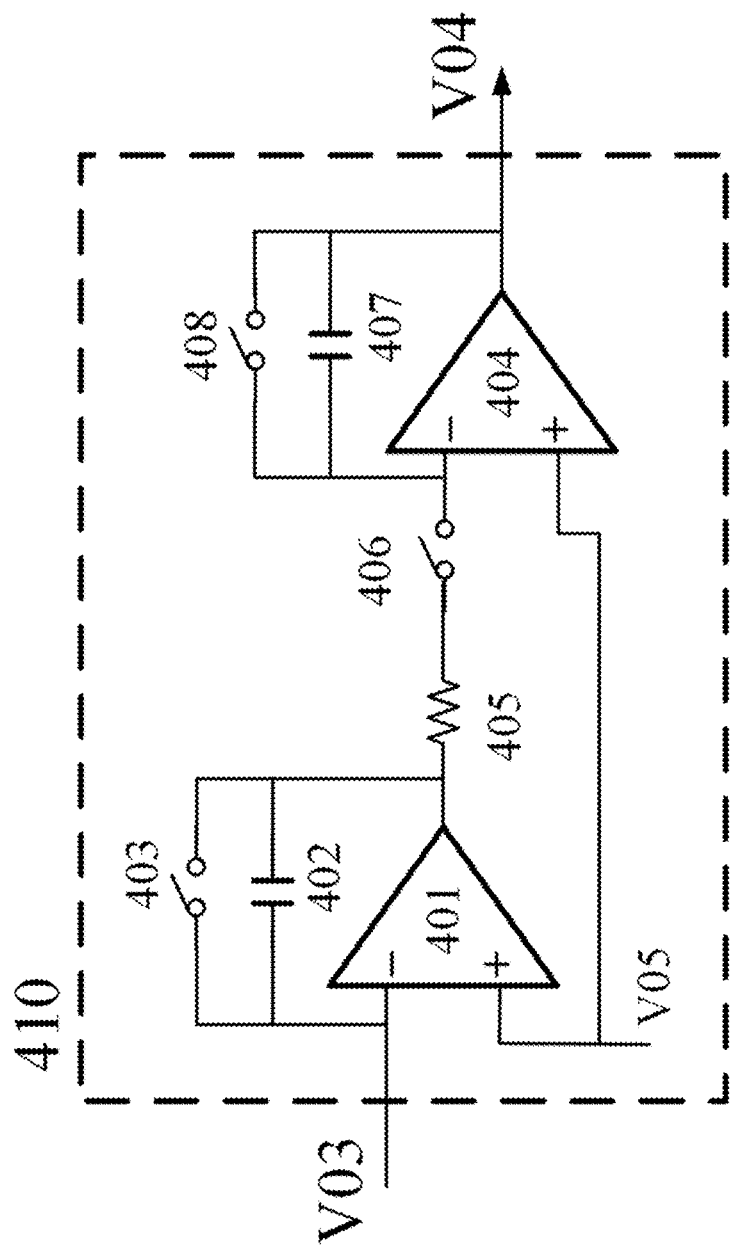
FIG. 6 illustrates a structure of the sensing unit in FIG. 5.

FIG. 6 illustrates a structure of the sensing units 410 and 420. The sensing unit 410 comprises a first amplifier 401 and a second amplifier 404. The first amplifier 401 has a positive input terminal connected to a reference voltage V05, and a negative input terminal connected to the sensing input voltage V03. A first capacitor 402 and a first timing switch 403 are connected between the negative input terminal and an output terminal of the first amplifier 401. The second amplifier 404 has a positive input terminal connected to the reference voltage V05, and a negative input terminal connected with the output terminal of the first amplifier 401 through a first resistor 405 and a second timing switch 406. A second capacitor 407 and a third timing switch 408 are connected between the negative input terminal of the second amplifier 404 and an output terminal. The output terminal of the second amplifier 404 outputs the sensing output voltage V04.

Figure 7:
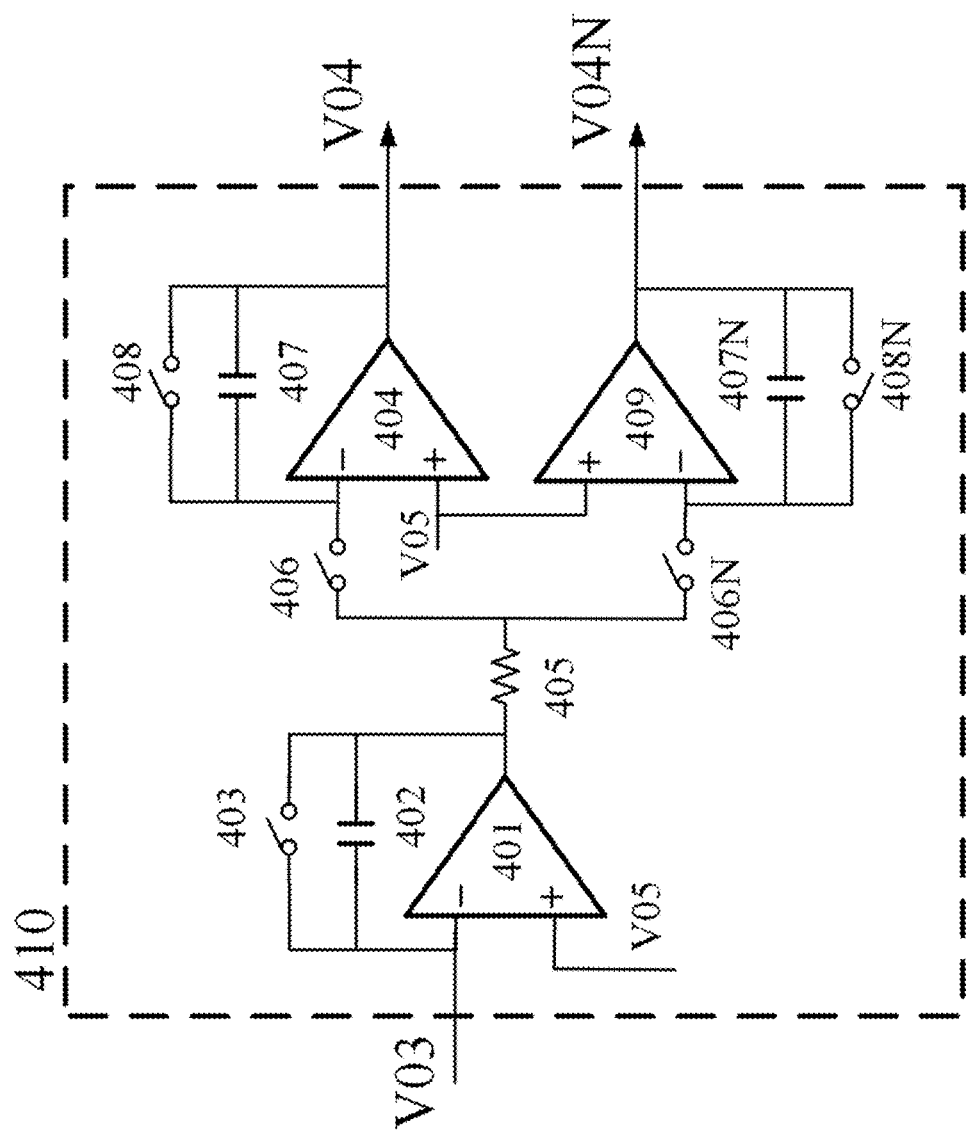
FIG. 7 illustrates a different structure from the sensing unit in FIG. 6.

FIG. 7 illustrates another structure of the sensing unit 410. In comparison with FIG. 6, the sensing unit 410 further comprises a third amplifier 409 having a positive input terminal connected to the reference voltage V04, and a negative input terminal connected with the first resistor 405 through a second timing negative switch 406N. A second negative capacitor 407N and a third timing negative switch 408N are connected between the negative input terminal of the third amplifier 409 and an output terminal. The output terminal of the third amplifier 409 outputs the sensing negative output voltage V04N.

According to the above capacitive touch sensor, the operation timing comprises: a first timing, in which the first timing switches 403 in the sensing units 410 and 420 are conducted, and the self-capacitance voltage switches 301 in the second switch units 310 are additionally conducted in the self-capacitance mode; a second timing, in which the second timing switch 406 is conducted, and a second timing negative switch 406N is additionally conducted if any; and a third timing, in which the third timing switches 408 are conducted, and a third timing negative switch 408N is additionally conducted if any.

Figure 8:
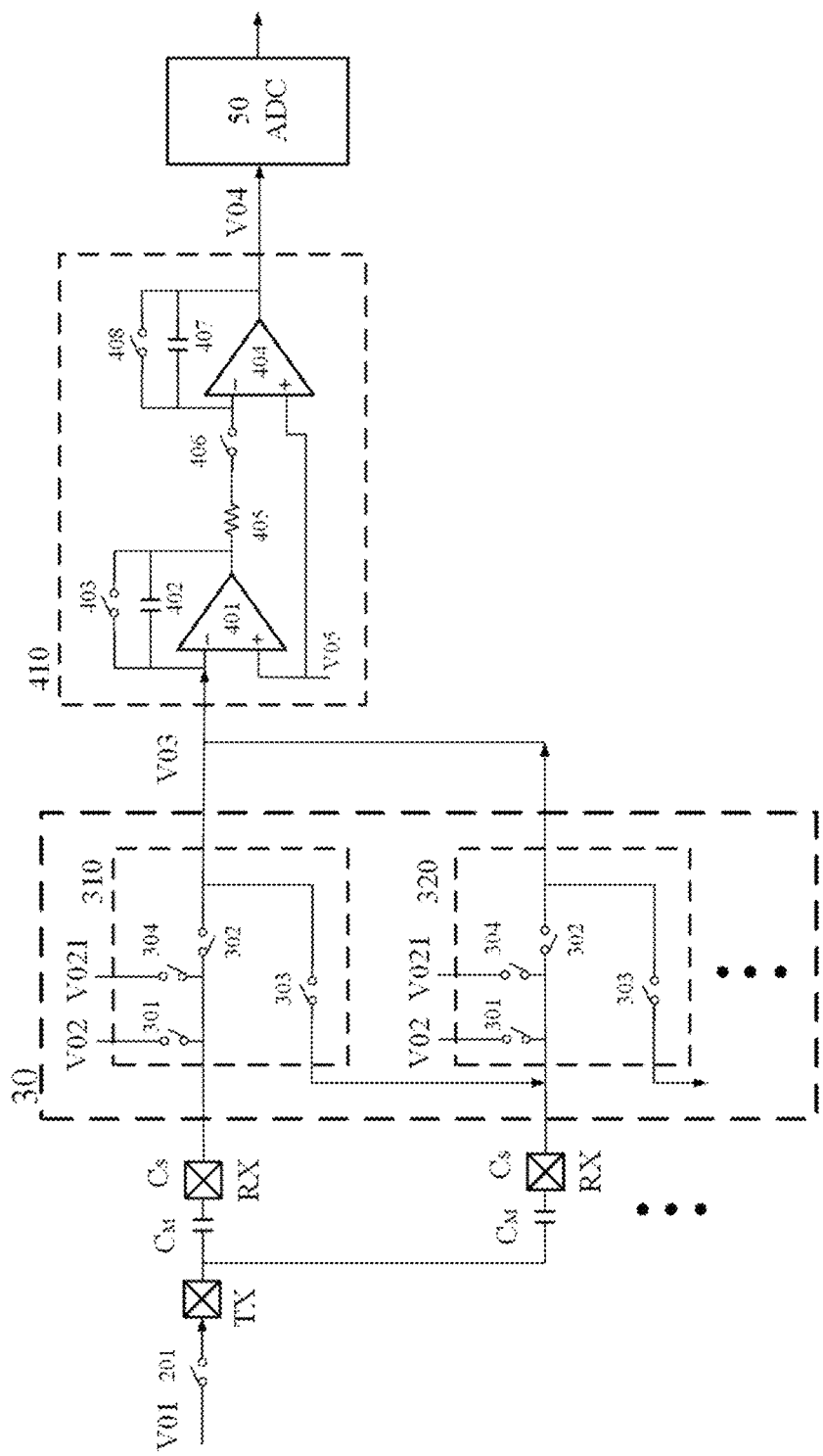
FIG. 8 illustrates a complete circuit of the capacitive touch sensor according to the first embodiment of the present invention.

FIG. 8 illustrates a complete circuit according to the first embodiment of the present invention. The second switch circuit 30 is the same as that in FIG. 4, while the sensing circuit 40 having one sensing unit 410 is the same as that in FIG. 6. The analog/digital converter 50 converts the received sensing output voltage V04 into a digital output signal.

Figure 9:
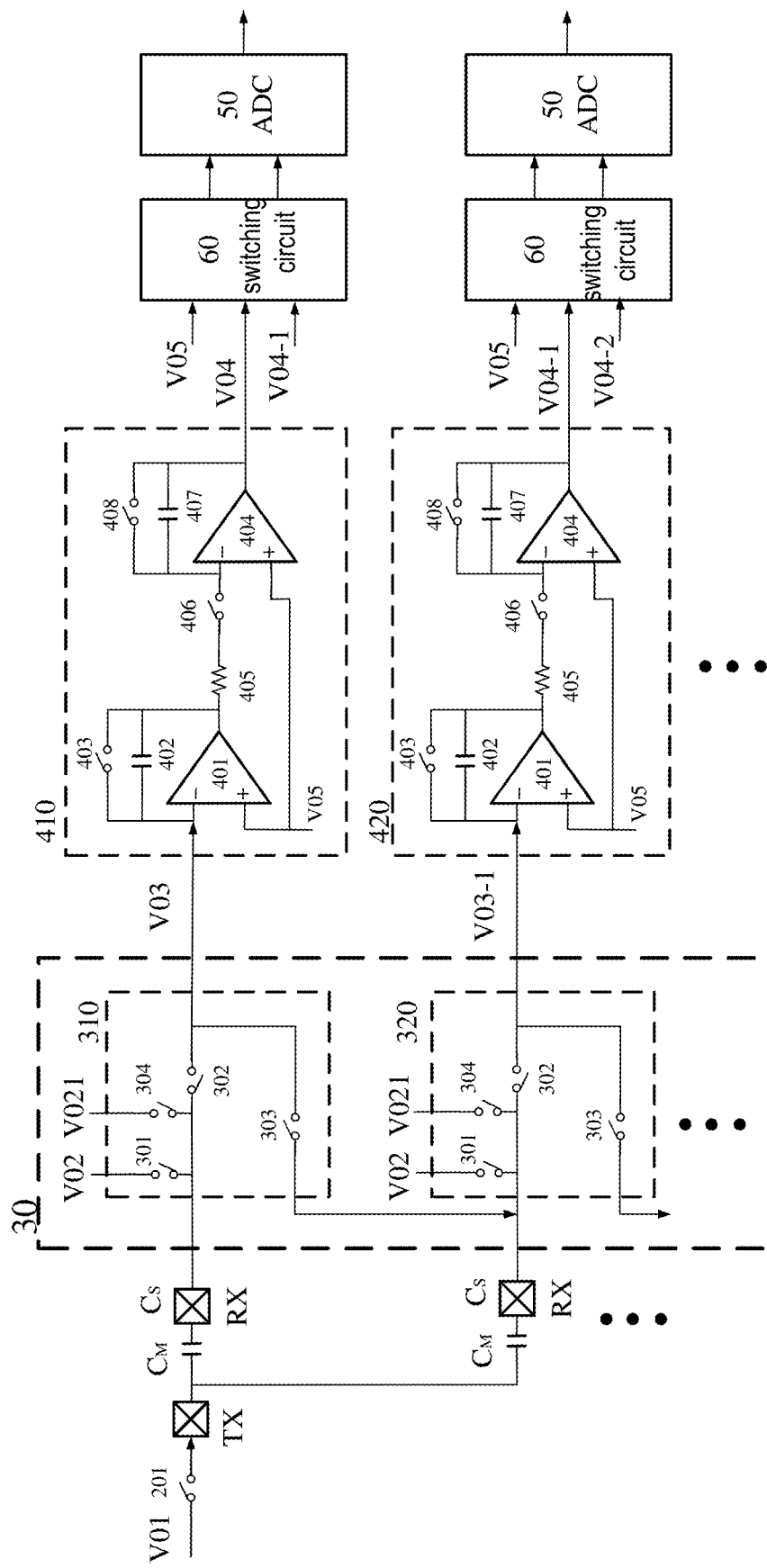
FIG. 9 illustrates a circuit of a capacitive touch sensor according to a second embodiment of the present invention.

FIG. 9 illustrates a circuit according to a second embodiment of the present invention. The second switch circuit 30 is the same as that in FIG. 4, while the sensing circuit 40 having multiple sensing units 410, 420 . . . is the same as that in FIG. 6. If the touch interface 10 comprises fifty first lines (TX) 101 and thirty second lines (RX) 102, then the second switch circuit 30 comprises thirty second switch units 310, 320 . . . , and the sensing circuit 40 comprises thirty sensing units 410, 420 . . . . In the mutual capacitance mode, the fifty first lines (TX) 101 conduct in turn corresponding first switch units 201, in order to activate the thirty sensing units 410, 420 . . . , and to detect mutual inducted capacitance $C_M$ of the thirty second lines (RX)102. In the self-capacitance mode, the above-mentioned odd mode and even mode are needed to detect self inducted capacitance $C_S$ of the thirty second lines (RX) 102. In addition, the fifty first lines (TX) 101 can be connected to the second switch circuit 30 and the sensing circuit 40 to detect self inducted capacitance Cs of the fifty first lines (TX) 101.

As shown in FIG. 9, the sensing units 410 and 420 each is connected with a switching circuit 60 for receiving the sensing output voltage V04, the sensing output voltage V04-1 of the adjacent sensing unit 420 and the reference voltage V05, and outputting a switching circuit positive output voltage V06 and a switching circuit negative output voltage V06N. There are two switching modes: first switching mode, in which the sensing output voltage V04 and the sensing output voltage V04-1 of the adjacent sensing unit 420 are selected as the switching circuit positive output voltage V06 and the switching circuit negative output voltage V06N; and second switching mode, in which the sensing output voltage V04 and the reference voltage V05 are selected as the switching circuit positive output voltage V06 and the switching circuit negative output voltage V06N.

For the switching circuit 60 as shown in FIG. 9, the second switching mode is selected in the self-capacitance mode to detect self inducted capacitance $C_S$ of the second line (RX) 102. The second switching mode is selected in the mutual capacitance mode to detect mutual inducted capacitance $C_M$ of the second line (RX)102. The first switching mode is selected in the mutual capacitance mode to detect difference ($C_{M-2}$-$C_{M-1}$) between mutual inducted capacitances $C_M$ of adjacent two second lines (RX) 102.

Figure 10:
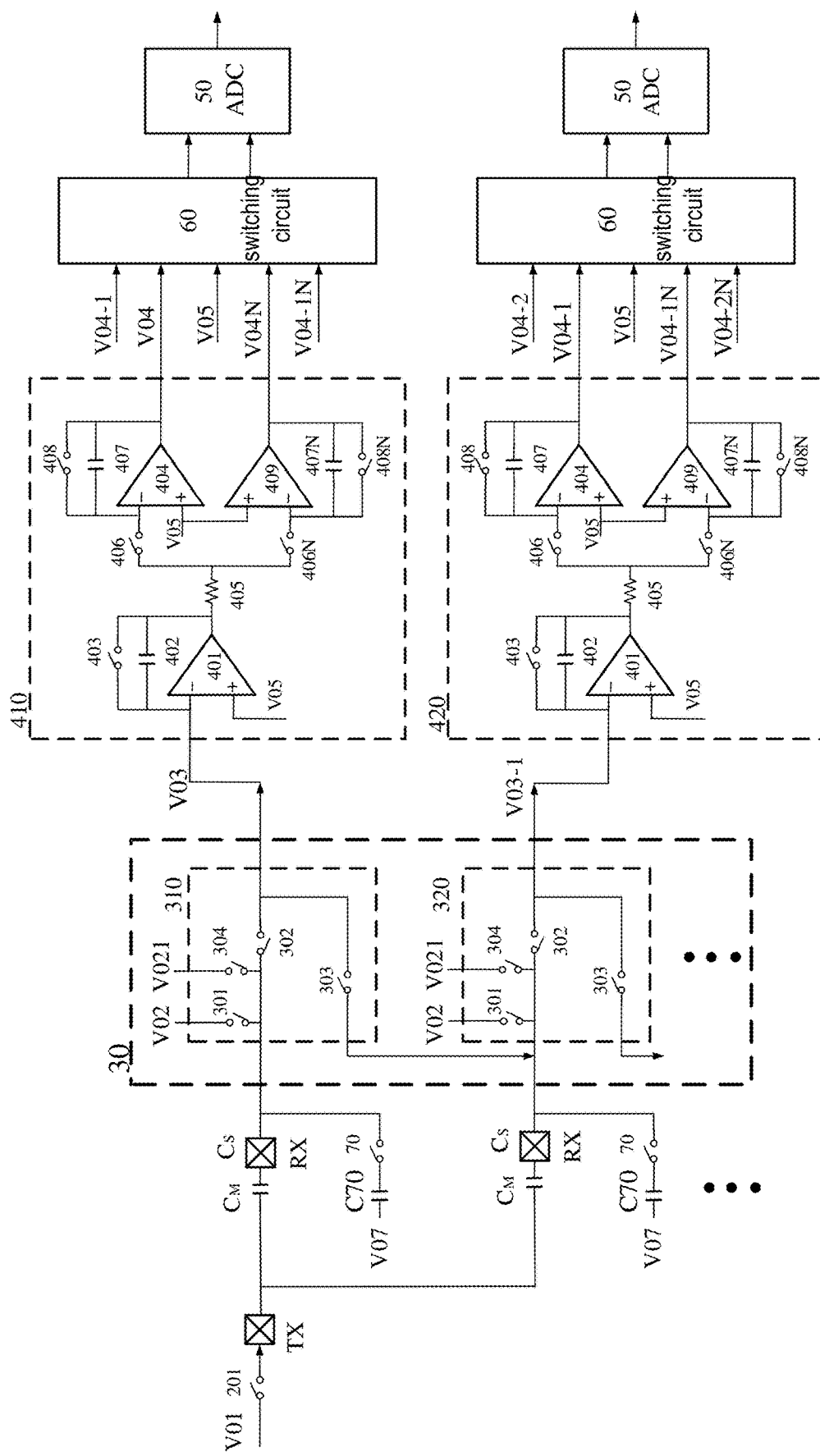
FIG. 10 illustrates a circuit of a capacitive touch sensor according to a third embodiment of the present invention.

FIG. 10 illustrates a circuit according to a third embodiment of the present invention. The second switch circuit 30 is the same as that in FIG. 4, and the sensing circuit 40 comprising multiple sensing units 410, 420 . . . is similar to that in FIG. 7, except sensing negative output voltages V04N, V04-1N . . . . The switching circuit 60 receives at least two voltages among the sensing output voltage V04, the sensing negative output voltage V04N, the sensing output voltage V04-1 of the adjacent sensing unit 420, the sensing negative output voltage V04-1N of the adjacent sensing unit 420 and the reference voltage V05, and outputs a switching circuit positive output voltage V06 and a switching circuit negative output voltage V06N. There are four switching modes: first switching mode, in which the sensing output voltage V04 and the adjacent sensing output voltage V04-1 are selected; second switching mode, in which the sensing output voltage V04 and the reference voltage V05 are selected; third switching mode, in which the sensing negative output voltage V04N and the adjacent sensing negative output voltage V04-1N are selected; and fourth switching mode, in which the sensing negative output voltage V04N and the reference voltage V05 are selected.

For the switching circuit 60 as shown in FIG. 10, the second switching mode or the fourth switching mode is selected in the self-capacitance mode to detect self inducted capacitance $C_S$ of the second line (RX) 102. The second switching mode or the fourth switching mode is selected in the mutual capacitance mode to detect mutual inducted capacitance $C_M$ of the second line (RX) 102. The first switching mode or the third switching mode is selected in the mutual capacitance mode to detect difference ($C_{M-2}$-$C_{M-1}$) between mutual inducted capacitances $C_M$ of adjacent two second lines (RX) 102.

As shown in FIG. 8, FIG. 9 or FIG. 10, an analog/digital converter 50 receives the sensing output voltage V04, the sensing negative output voltage V04N, the switching circuit positive output voltage V06 or the switching circuit negative output voltage V06N, and outputs a digital signal.

As shown in FIG. 10, the second lines (RX) 102 in the touch interface 10 each is connected with a reference capacitance switch 70 having another end connected to a reference capacitor C70 applied with a mutual capacitance second voltage V07. The reference capacitance switch 70 is conducted in the mutual capacitance mode and turned off in the self-capacitance mode. The reference capacitance switch 70, the reference capacitor C70 and the mutual capacitance second voltage V07 can also be used in the first and second embodiments in FIG. 1, FIG. 8 or FIG. 9. Thus, the mutual inducted capacitance $C_M$ can be deducted by a reference value, thereby enhancing uniformity of the sensed results.

Figure 11:
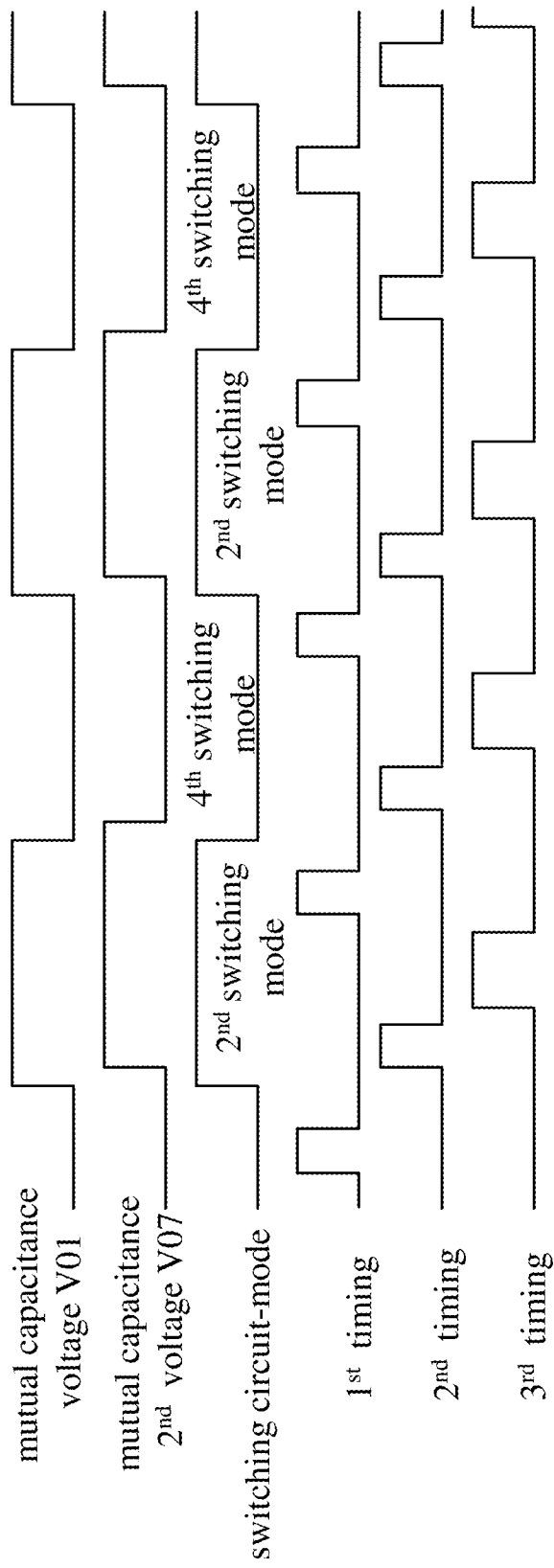
FIG. 11 illustrates an operation timing chart for the capacitive touch sensor according to the present invention.

FIG. 11 illustrates an operation timing chart for the capacitive touch sensor according to the present invention. The mutual capacitance voltage V01 and the mutual capacitance second voltage V07 both have square waveforms. The first switch circuit 20 and the second switch circuit 30 are operated according to the mutual capacitance mode. The reference voltage V05 is set as half of supply voltage (VDD/2). The switching circuit 60 selects the second switching mode when the mutual capacitance voltage V01 is high and selects the fourth switching mode when it is low. In the first timing, the second timing and the third timing, charge transfer process is used to transform the mutual inducted capacitance CM into the sensing output voltage V04, which is converted into a digital signal by the analog/digital converter Operation timing for the self-capacitance mode according to the present invention is also shown in FIG. 11. The first switch circuit 20 and the second switch circuit 30 are operated according to the self-capacitance mode. The self-capacitance voltage V02 is set as supply voltage (VDD), the second self-capacitance voltage V021 is set as 0 V, and the reference voltage V05 is set as half of supply voltage (VDD/2). The switching circuit 60 selects the second switching mode when the mutual capacitance voltage V01 is high and selects the fourth switching mode when it is low. In the first timing, the second timing and the third timing, charge transfer process is used to transform the self inducted capacitance $C_S$ into the sensing output voltage V04, which is converted into a digital signal by the analog/digital converter 50.

According to the present invention, the self-capacitance mode is executed first to determine whether there are any self-capacitance sensing values in the first lines (TX) 101 exceeding a predetermined range. Then, the mutual capacitance mode is executed to carry out mutual capacitance scan for the first lines (TX) 101 having self-capacitance sensing values exceeding the predetermined range and the rest of the first lines (TX) 101 are ignored, thereby saving operation time for the mutual capacitance mode. If the touch interface 10 comprises fifty first lines (TX) 101 and thirty second lines (RX) 102, the self-capacitance mode is used for the fifty first lines (TX) 101. If three first lines (TX) 101 have self-capacitance sensing values exceeding the predetermined range, it means that only these three first lines (TX) 101 are possibly touched by a finger. Next, in the mutual capacitance mode, mutual capacitance scan is executed for these three first lines (TX) 101 only, regardless of the remaining forty-seven first lines (TX) 101. Conventionally, mutual capacitance sensing data of 50×30=1500 are needed in the mutual capacitance mode. However, according to the present invention, mutual capacitance sensing data of 3×30=90 are enough, thereby saving operation time for the mutual capacitance mode and enhancing reporting rate.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A capacitive touch sensor, comprising:
    a touch interface having first lines and second lines;
    a first switch circuit connected between the first lines and a mutual capacitance voltage;
    a second switch circuit, connected with the first lines and the second lines, for receiving a self-capacitance voltage and generating a sensing input voltage; and
    a sensing circuit for receiving the sensing input voltage and generating a sensing output voltage,
    wherein the second switch circuit comprises second switch units, each including:
        a self-capacitance voltage switch connected between the self-capacitance voltage and the touch interface;
        a first sensing switch connected between the touch interface and output terminals of the switch units; and
        a second sensing switch connected between output terminals of the switch circuits and adjacent switch unit.

2. The capacitive touch sensor according to claim 1, wherein the first switch circuit comprises at least a first switch unit connected between the first lines and the mutual capacitance voltage.

3. The capacitive touch sensor according to claim 1, wherein the second switch unit further comprises a second self-capacitance switch connected between a second self-capacitance voltage and the touch interface.

4. The capacitive touch sensor according to claim 3, wherein the sensor is provided with:
    a mutual capacitance mode, in which the first switch circuit conducts the first switch units sequentially and provides the mutual capacitance voltage to the first lines whereas the second switch units conduct the first sensing switch and turn off the self-capacitance voltage switch, the second sensing switch and the second self-capacitance switch; and
    a self-capacitance mode, in which the first switch units are turned off, the second switch units conduct the first sensing switch or the second sensing switch based on channel scan, the self-capacitance voltage switch or the second self-capacitance switch is conducted based on operation timing of the sensing circuit, and the self-capacitance voltage or the second self-capacitance voltage is provided to the second lines or the first lines.

5. The capacitive touch sensor according to claim 4, wherein the self-capacitance mode is executed first to determine whether there are any self-capacitance sensing values in the first lines exceeding a predetermined range, and then the mutual capacitance mode is executed to carry out mutual capacitance scan for the first lines having self-capacitance sensing values exceeding the predetermined range and ignore the rest of the first lines.

6. The capacitive touch sensor according to claim 4, wherein the self-capacitance mode comprises:
    an odd mode, in which the first sensing switch and the second sensing switch in the odd-numbered second switch units are conducted, the self-capacitance voltage switch is conducted based on operation timing of the sensing circuit, and the second self-capacitance switch is turned off; and the first sensing switch and the second sensing switch in the even-numbered second switch units are turned off, the second self-capacitance switch is conducted based on operation timing of the sensing circuit, and the self-capacitance voltage switch is turned off; and
    an even mode, in which the first sensing switch and the second sensing switch in the even-numbered second switch units are conducted, the second self-capacitance switch is conducted based on operation timing of the sensing circuit, and the self-capacitance voltage switch is turned off; and the first sensing switch and the second sensing switch in the odd-numbered second switch units are turned off, the elf-capacitance voltage switch is conducted based on operation timing of the sensing circuit, and the second self-capacitance switch is turned off.

7. The capacitive touch sensor according to claim 4, wherein the sensing circuit comprises one or more sensing units; when there is only one sensing unit, the first sensing switch or the second sensing switch in the second switch units are sequentially conducted during scanning to obtain a sensing output voltage from each of the first line or the second line; and when there are more than one sensing unit, the second switch units have out terminals connected to the sensing units to conduct the first sensing switch or the second sensing switch, thereby obtaining sensing output voltages from the sensing units.

8. The capacitive touch sensor according to claim 7, wherein the sensing unit comprises:
- a first amplifier having a positive input terminal connected to a reference voltage and a negative input terminal connected to an output terminal of the switch circuit, the negative input terminal and the output terminal of the first amplifier being connected with a first capacitor and a first timing switch; and
- a second amplifier having a positive input terminal connected to the reference voltage and a negative input terminal connected to the output terminal of the first amplifier through a first resistor and a second timing switch, the negative input terminal and an output terminal of the second amplifier being connected with a second capacitor and a third timing switch; and
- wherein the output terminal of the second amplifier is used for output of the sensing circuit.

9. The capacitive touch sensor according to claim 8, wherein the sensing unit further comprises a third amplifier having a positive input terminal connected to the reference voltage and a negative input terminal connected to the first resistor through a second timing negative switch, the negative input terminal and an output terminal of the third amplifier being connected with a second negative capacitor and a third timing negative switch; and wherein the output terminal of the third amplifier is used for negative output of the sensing circuit.

10. The capacitive touch sensor according to claim 9, in which:
- the first timing switch of the sensing unit is conducted at a first timing, and the self-capacitance voltage switches in the second switch units are additionally conducted in the self-capacitance mode;
- the second timing switch or the second timing negative switch of the sensing unit is conducted at a second timing; and
- the third timing switch or the third timing negative switch of the sensing unit is conducted at a third timing.

11. The capacitive touch sensor according to claim 8, wherein the sensing unit is connected with a switching circuit for receiving at least two voltages among the sensing output voltage, the sensing output voltage of the adjacent sensing unit and the reference voltage, and outputting a switching circuit positive output voltage and a switching circuit negative output voltage, and is provided with at least one of the following modes:
- a first switching mode, in which the sensing output voltage of the sensing unit and the sensing output voltage of the adjacent sensing unit are selected as the switching circuit positive output voltage and the switching circuit negative output voltage, respectively; and
- a second switching mode, in which the sensing output voltage of the sensing unit and the reference voltage are selected as the switching circuit positive output voltage and the switching circuit negative output voltage, respectively.

12. The capacitive touch sensor according to claim 9, wherein the sensing unit sends a sensing negative output voltage to a switching circuit for receiving at least two voltages among the sensing output voltage, the sensing negative output voltage, the sensing output voltage of the adjacent sensing unit, the sensing negative output voltage of the sensing unit, and the reference voltage, and for outputting a switching circuit positive output voltage and a switching circuit negative output voltage, and is provided with at least one of the following modes:
- a first switching mode, in which the sensing output voltage of the sensing unit and the sensing output voltage of the adjacent sensing unit selected as the switching circuit positive output voltage and the switching circuit negative output voltage, respectively;
- a second switching mode, in which the sensing output voltage of the sensing unit and the reference voltage are selected as the switching circuit positive output voltage and the switching circuit negative output voltage, respectively;
- a third switching mode, in which the sensing negative output voltage of the sensing unit and the sensing negative output voltage of the adjacent sensing unit are selected as the switching circuit positive output voltage and the switching circuit negative output voltage, respectively; and
- a fourth switching mode, in which the sensing negative output voltage of the sensing unit and the reference voltage are selected as the switching circuit positive output voltage and the switching circuit negative output voltage, respectively.

13. The capacitive touch sensor according to claim 11, further comprising an analog/digital converter for receiving voltages from the sensing circuit and the switching circuit and outputting a digital signal.

14. The capacitive touch sensor according to claim 4, wherein each of the first lines or the second lines in the touch interface is connected with a reference capacitance switch having another end connected to a reference capacitor applied with a mutual capacitance second voltage; and the reference capacitance switches are conducted in the mutual capacitance mode and turned off in the self-capacitance mode.

* * * * *